(12) United States Patent
Lim

(10) Patent No.: US 12,399,221 B2
(45) Date of Patent: Aug. 26, 2025

(54) PRESSURE ACTIVATION APPARATUS PROVIDED WITH SHORT-CIRCUITING INSPECTION SECTION FOR BATTERY CELL

(71) Applicant: APRO CO., LTD, Gunpo-si (KR)

(72) Inventor: Jong Hyun Lim, Gunpo-si (KR)

(73) Assignee: APRO CO., LTD, Gunpo-si (KR)

( * ) Notice: Subject to any disclaimer, the term of this patent is extended or adjusted under 35 U.S.C. 154(b) by 190 days.

(21) Appl. No.: 18/272,350

(22) PCT Filed: Dec. 20, 2021

(86) PCT No.: PCT/KR2021/019364
§ 371 (c)(1),
(2) Date: Jul. 14, 2023

(87) PCT Pub. No.: WO2022/164033
PCT Pub. Date: Aug. 4, 2022

(65) Prior Publication Data
US 2024/0077536 A1    Mar. 7, 2024

(30) Foreign Application Priority Data
Feb. 1, 2021 (KR) .................. 10-2021-0014162

(51) Int. Cl.
*G01R 31/36* (2020.01)
*G01R 31/52* (2020.01)
(Continued)

(52) U.S. Cl.
CPC ......... *G01R 31/3644* (2013.01); *G01R 31/52* (2020.01); *H01M 10/0404* (2013.01); *H01M 10/0481* (2013.01); *H01M 10/4285* (2013.01)

(58) Field of Classification Search
CPC .................. G01R 31/3644; G01R 31/52; G01R 31/3865; G01R 31/396; H01M 10/0404;
(Continued)

(56) References Cited

U.S. PATENT DOCUMENTS

| 5,212,867 | A | 5/1993 | Vogel |
| 2015/0093567 | A1 | 4/2015 | Jeon |
| 2022/0065948 | A1* | 3/2022 | Kim .................. H01M 10/4285 |

FOREIGN PATENT DOCUMENTS

| CN | 206947454 U | * | 1/2018 |
| JP | 2013-178898 A | | 9/2013 |

(Continued)

OTHER PUBLICATIONS

International Search Report for PCT/KR2021/019364 mailed Mar. 22, 2022 from Korean Intellectual Property Office.

*Primary Examiner* — Feba Pothen
(74) *Attorney, Agent, or Firm* — Revolution IP, PLLC

(57) ABSTRACT

Disclosed is a pressure activation apparatus, and particularly to a pressure activation apparatus with a short-circuiting inspection section for a battery cell, in which a short-circuiting inspection, an activation process, and a charging and discharging process are sequentially and successively performed for a plurality of battery cells within a single pressure activation apparatus, and thus there is no need to separately build short-circuiting inspection equipment, thereby reducing the maintenance, efforts and costs of performing the short-circuiting inspection process, the pressure activation process and the charging and discharging process for the battery cell, and reducing unnecessary waste of space, time, costs, etc. to build the separate equipment.

1 Claim, 3 Drawing Sheets

(51) Int. Cl.
*H01M 10/04* (2006.01)
*H01M 10/42* (2006.01)

(58) Field of Classification Search
CPC ......... H01M 10/0481; H01M 10/4285; H01M 10/049; H01M 10/446; H01M 10/482; H01M 4/044; Y02E 60/10; Y02P 70/50
See application file for complete search history.

(56) References Cited

FOREIGN PATENT DOCUMENTS

| | | |
|---|---|---|
| KR | 10-1381772 B1 | 4/2014 |
| KR | 10-2015-0037049 A | 4/2015 |
| KR | 10-2017-0112628 A | 10/2017 |
| KR | 10-2020-0042801 A | 4/2020 |

\* cited by examiner

[FIG.1]
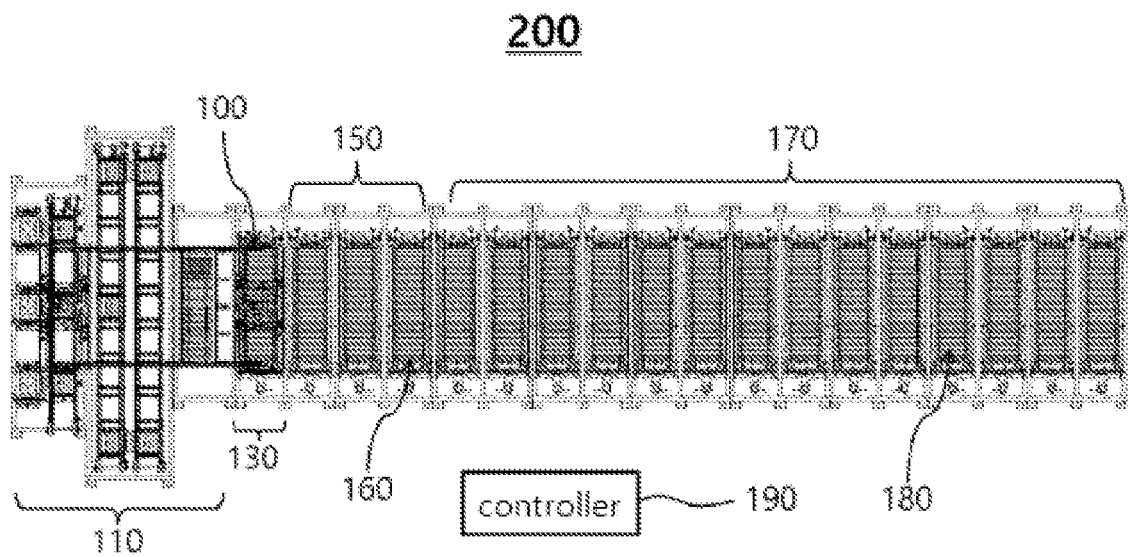
[FIG.2]
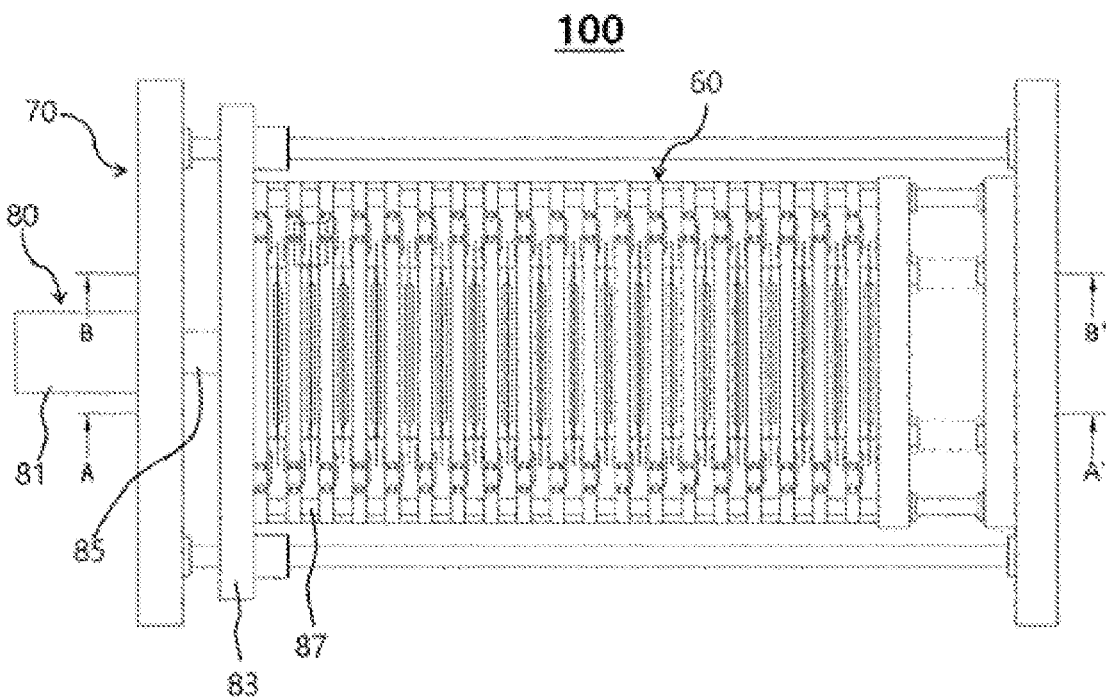

[FIG.3]
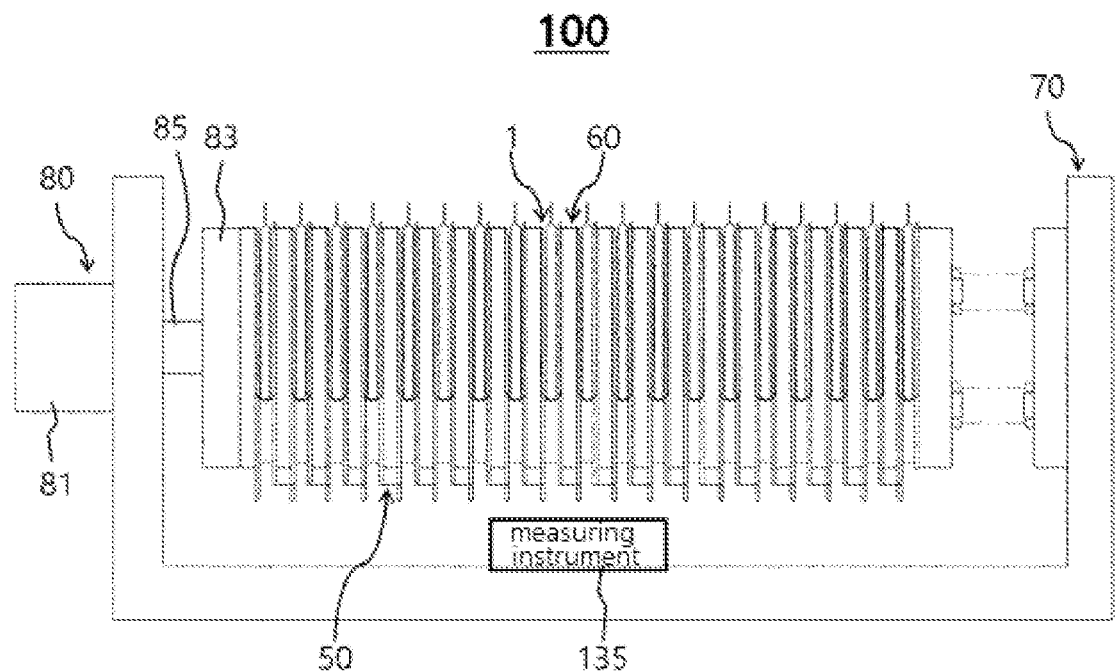
[FIG.4]
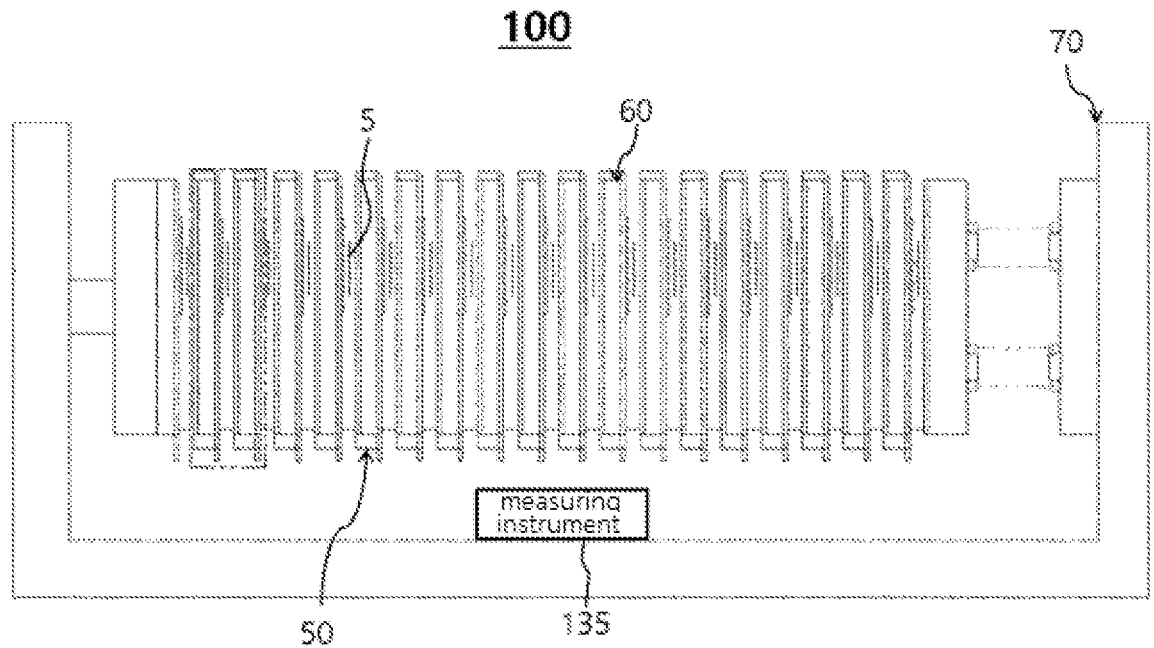

[FIG.5]
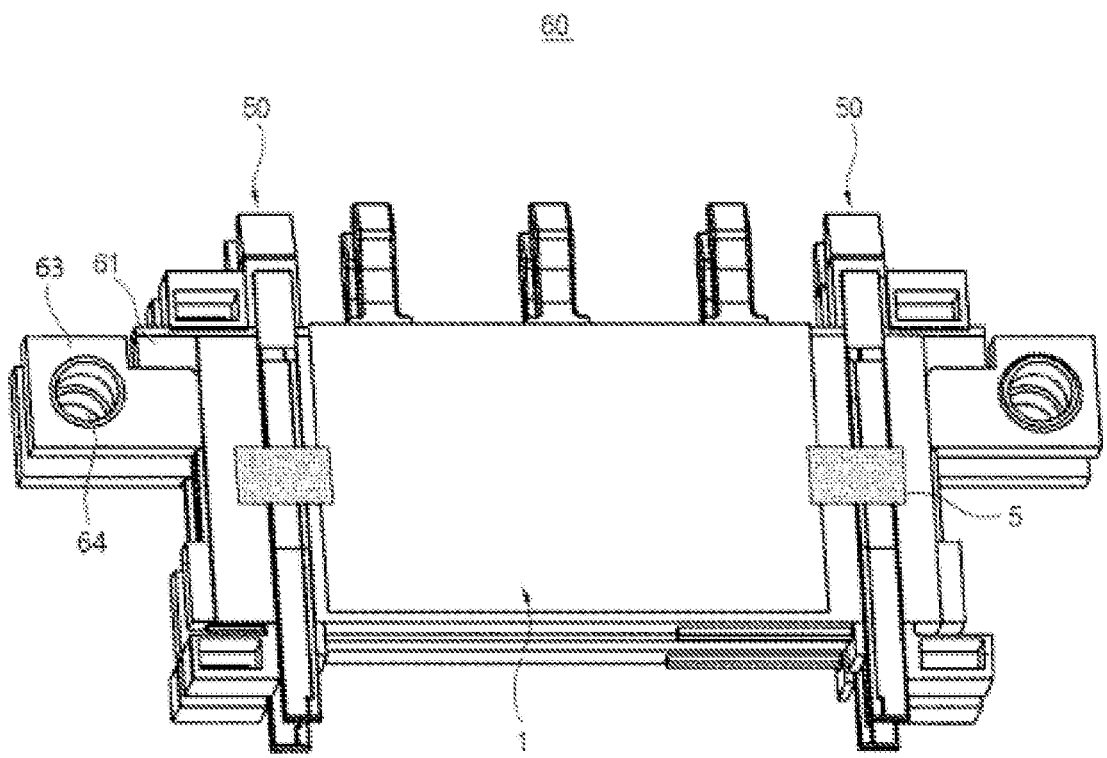

PRESSURE ACTIVATION APPARATUS PROVIDED WITH SHORT-CIRCUITING INSPECTION SECTION FOR BATTERY CELL

TECHNICAL FIELD

The disclosure relates to a pressure activation apparatus, and particularly to a pressure activation apparatus with a short-circuiting inspection section for a battery cell, in which a short-circuiting inspection, an activation process, and a charging and discharging process are sequentially and successively performed for a plurality of battery cells within a single pressure activation apparatus, and thus there is no need to separately build short-circuiting inspection equipment, thereby reducing the maintenance, efforts and costs of performing the short-circuiting inspection process, the pressure activation process and the charging and discharging process for the battery cell, and reducing unnecessary waste of space, time, costs, etc. to build the separate equipment.

BACKGROUND ART

With recent rapid development of electrical, electronic, communication and computer industries, the demand for high-performance and high-safety batteries is gradually increasing. In particular, as electronic devices are rapidly becoming smaller, thinner, and lighter, the need for making the battery small and thin is increasing day by day. To meet these demands, lithium secondary batteries having high energy density have recently attracted the most attention.

The lithium secondary batteries have the advantages of long life and large capacity, and thus have recently been widely used in portable electronic devices. According to the types of electrolytes, the lithium secondary batteries include lithium metal batteries and lithium ion batteries which use liquid electrolytes, and lithium polymer batteries, and lithium polymer batteries which use polymer solid electrolyte. Further, according to the types of exterior material that seals an electrode assembly, the lithium secondary batteries are classified into square-type batteries using a square can, cylindrical-type batteries using a cylindrical can, and pouch-type batteries using a pouch.

Among them, the pouch-type batteries have recently been being actively developed because of many advantages such as higher energy density per unit weight and volume, and the exterior material that not only makes the battery thin and lightweight but also has low material costs.

A method of manufacturing such a pouch-type battery includes first manufacturing an anode plate and a cathode plate, interposing a separator between the anode plate and the cathode plate, and stacking them to form an electrode assembly. The electrode assembly manufactured as above is embedded in a pouch casing, and electrode leads are electrically connected to the electrode assembly and formed protruding outwardly from the pouch casing. After embedding the electrode assembly in the pouch casing, an electrolyte is injected into the pouch so that the electrode assembly can be impregnated with the electrolyte. After injecting the electrolyte, the edges of the pouch are joined by thermal fusion to seal the pouch.

The pouch-type battery completely assembled as described above is then subjected to a pressure activation process (or pre-formation process) for pressurizing and activating the pouch to evenly spread the electrolyte filled in the pouch, an aging process for stabilizing the battery, and a charging and discharging process (or formation process) for activating the battery.

Meanwhile, separately from the pressure activation process and the charging and discharging process, a battery cell needs to be subjected to a short-circuiting inspection process to determine whether the battery cell is defective. To this end, conventionally, short-circuiting inspection equipment for the battery cell is provided separately from a pressure activation apparatus that performs the activation process and the charging and discharging process, and the separate short-circuiting inspection equipment is used to perform the short-circuiting inspection for the battery cell before performing the pressure activation process for the battery cell.

In this way, conventionally, the short-circuiting inspection for the battery cell is performed through the short-circuiting inspection equipment provided separately form pressure activation equipment, and then the pressure activation process and the charging and discharging process are performed through the pressure activation equipment. Therefore, the short-circuiting inspection process, the pressure activation process and the charging and discharging process are not performed as a series of consecutive processes in one equipment, thereby having disadvantages of unnecessarily requiring maintenance, efforts and costs to perform the short-circuiting inspection process, the pressure activation process and the charging and discharging process for the battery cell. Further, there are disadvantages of requiring more space, time, and costs to build the separate equipment.

In this regard, Korean Patent Publication No. 10-2020-0042801 (hereinafter referred to as the "related art document") proposes a formation apparatus capable of performing a defect inspection and an activation process for a pouch-type secondary battery cell completely subjected to a packaging process.

However, the foregoing related art document relates to an apparatus capable of performing the short-circuiting inspection and the activation process for the pouch-type secondary battery cell mounted to one jig, but not to an apparatus capable of continuously performing the short-circuiting inspection and the activation process in a series of consecutive processes using separate jigs, thereby having disadvantages of a low process efficiency for a plurality of battery cells required to be subjected to a plurality of processes.

DISCLOSURE

Technical Problem

The disclosure is conceived to solve the foregoing problems of the related art, and an aspect of the disclosure is to provide a pressure activation apparatus with a short-circuiting inspection section for a battery cell, in which a short-circuiting inspection, an activation process, and a charging and discharging process are sequentially and successively performed for a plurality of battery cells within a single pressure activation apparatus, and thus there is no need to separately build short-circuiting inspection equipment, thereby reducing the maintenance, efforts and costs of performing the short-circuiting inspection process, the pressure activation process and the charging and discharging process for the battery cell, and reducing unnecessary waste of space, time, costs, etc. to build the separate equipment.

Technical Solution

A pressure activation apparatus with a short-circuiting inspection section for a battery cell, proposed to solve the aforementioned problems, includes: a loading section to load a plurality of battery cells; a short-circuiting inspection section to perform a short-circuiting inspection while the plurality of battery cells transported from the loading section are mounted and pressurized; a preliminary activation section to perform an activation process while the plurality of battery cells, which have been subjected to the short-circuiting inspection, transported from the short-circuiting inspection section are mounted and pressurized; a main activation section to perform a charging and discharging process while the plurality of battery cells, which have been subjected to the activation process, transported from the preliminary activation section are mounted, heated and pressurized; and a controller to control the transportation of the plurality of battery cells, the short-circuit inspection, the activation process, and the charging and discharging process.

Here, the short-circuiting inspection section may include one pressurization short-circuiting jig to mount and pressurize the plurality of battery cells, the preliminary activation section may include a plurality of preliminary jigs to mount and pressurize the plurality of battery cells, and the main activation section may include a plurality of heating jigs to heat and pressurize the plurality of battery cells.

Here, the short-circuiting inspection section may include a measuring instrument to measure a current by applying a voltage to each of the plurality of battery cells mounted to the one pressurization jig under control of the controller, and transmit the current measured for each battery cell to the controller.

Here, the controller may determine whether each battery cell is defective or not by analyzing the current measured for each battery cell, and control the battery cell determined to be defective not to undergo the charging and discharging process in the heating jigs.

Advantageous Effects

Regarding the foregoing problems and solutions, there is provided a pressure activation apparatus with a short-circuiting inspection section for a battery cell, in which a short-circuiting inspection, an activation process, and a charging and discharging process are sequentially and successively performed for a plurality of battery cells within a single pressure activation apparatus, and thus there is no need to separately build short-circuiting inspection equipment, thereby reducing the maintenance, efforts and costs of performing the short-circuiting inspection process, the pressure activation process and the charging and discharging process for the battery cell, and reducing unnecessary waste of space, time, costs, etc. to build the separate equipment.

DESCRIPTION OF DRAWINGS

FIG. 1 is a schematic plan view of a pressure activation apparatus with a short-circuiting inspection section for a battery cell according to an embodiment of the disclosure.

FIG. 2 is a schematic plan view of a pressurization short-circuiting jig included in a short-circuiting inspection section of a pressure activation apparatus with the short-circuiting inspection section for a battery cell according to an embodiment of the disclosure.

FIG. 3 is a cross-sectional view taken along line A-A' of FIG. 2, and

FIG. 4 is a cross-sectional view taken along line B-B' of FIG. 2.

FIG. 5 is a perspective view of a pressurization module of a pressurization short-circuiting jig applied to the disclosure.

BEST MODE

Regarding the foregoing problems, solutions and effects, embodiments of a pressure activation apparatus with a short-circuiting inspection section for a battery cell according to the disclosure will be described below with reference to the accompanying drawings.

FIG. 1 is a schematic plan view of a pressure activation apparatus with a short-circuiting inspection section for a battery cell according to an embodiment of the disclosure.

As shown in FIG. 1, a pressure activation apparatus 200 with a short-circuiting inspection section for a battery cell according to an embodiment of the disclosure includes a loading section 110 to load a plurality of battery cells, a short-circuiting inspection section 130 to perform a short-circuiting inspection for the plurality of battery cells, a preliminary activation section 150 to perform an activation process for the plurality of battery cells, a main activation section 170 to perform a charging and discharging process for the plurality of battery cells, and a controller 190 to control the operations of the foregoing sections.

The loading section 110, the short-circuiting inspection section 130, the preliminary activation section 150, and the main activation section 170 perform the corresponding operations for the plurality of battery cells sequentially and successively under control of the controller 190.

The loading section 110 performs an operation of loading a plurality of battery cells. Specifically, the loading section 110 performs the operation of loading the battery cells from a tray, to which the plurality of battery cells are mounted, to the short-circuiting inspection section 130. The loading section 110 performs the operation of loading the plurality of battery cells to the short-circuiting inspection section 130 after undergoing various processes such as tray alignment, barcode recognition (BCR) reading, battery cell loading, and BCR reading for the battery cells.

The plurality of battery cells are transported from the loading section 110 to the short-circuiting inspection section 130 by a transportation means such as a pick-and-place and then mounted in the short-circuiting inspection section 130. Specifically, the pick-and-place or the like transportation means transports a plurality of battery cells from the loading section 110 to the short-circuiting inspection section 130, and mounts the plurality of battery cells to a pressurization short-circuiting jig 100 included in the short-circuiting inspection section 130.

The short-circuiting inspection section 130, which has received the plurality of battery cells from the loading section 110, performs the short-circuiting inspection for the plurality of cells. Specifically, the short-circuiting inspection section 130 mounts the plurality of battery cells received from the loading section 110 and performs the short-circuiting inspection while the plurality of battery cells are pressurized.

The plurality of battery cells loaded by the loading section 110 are not immediately subjected to the pressure activation process, but rather transported to the short-circuiting inspection section 130 beforehand and then subjected to the short-circuit inspection while being pressurized. As a result, it is not necessary to build separate short-circuiting inspection equipment that performs the short-circuiting inspection for the plurality of battery cells.

The short-circuiting inspection section 130 mounts the plurality of battery cells through the pressurization short-circuiting jig 100 (to be described later) and performs the short-circuiting inspection at a time while the plurality of battery cells are pressurized, thereby determining at once whether the plurality of battery cells are defective or not. Thus, the short-circuiting inspection for the plurality of battery cells is quickly performed, and successively performed for the plurality of battery cells continuously loaded from the loading section 110.

When the short-circuiting inspection for the plurality of battery cells is completed in the short-circuiting inspection section 130, the transportation means such as the pick-and-place transports the plurality of battery cells, which have been subjected to the short-circuiting inspection, to the preliminary activation section 150 under the control of the controller 190. Then, the preliminary activation section 150 performs an activation process by pressurizing the transferred plurality of battery cells. Specifically, the preliminary activation section 150 receives and mounts the plurality of battery cells, which have undergone the short-circuiting inspection, from the short-circuiting inspection section 130, and performs the activation process by pressurizing the plurality of battery cells.

the preliminary activation section 150 mounts the plurality of battery cells to a preliminary jig 160 (to be described later), which is configured similarly to the pressurization short-circuiting jig 100, and then performs the activation process by pressurizing the plurality of battery cells under the control of the controller 190. Such a preliminary activation process is based on a conventional preliminary activation process. As such a pressure activation process precedes, the charging and discharging process that follows in succession may proceed more efficiently.

When the pressure activation process for the plurality of battery cells is completed in the preliminary activation section 150, the pick-and-place or the like transportation means transports the plurality of battery cells, which has been subjected to the pressure activation process, to the main activation section 170 under the control of the controller 190. Then, the main activation section 170 heats and pressurizes the plurality of received battery cells to perform the charging and discharging process. Specifically, the main activation section 170 receives and mounts the plurality of batteries that have undergone the activation process, from the preliminary activation section 150, and heats and pressurizes the plurality of battery cells to perform the charging and discharging process.

The main activation section 170 mounts the plurality of battery cells to a heating jig 180 (to be described later), which is configured similarly to the pressurization short-circuit jig 100 or the preliminary jig 160 but additionally includes a heating means for heating the battery cells, and performs the charging and discharging process while heating and pressurizing the plurality of battery cells under the control of the controller 190. Such a charging and discharging process is based on the conventional charging and discharging process.

The loading operation for the plurality of battery cells by the loading section 110, the short-circuiting inspection operation for the plurality of battery cells by the short-circuiting inspection section 130, the preliminary activation process operation for the plurality of battery cells by the preliminary activation section 150, the charging and discharging process operation for the plurality of battery cells by the main activation section 170, the transportation operation for the plurality of battery cells, etc. are performed under the control of the controller 190. In other words, the controller 190 controls the operations of the transportation, the short-circuiting inspection, the activation process, and the charging and discharging process for the plurality of battery cells.

With the foregoing configurations and operations, the pressure activation apparatus 200 including the short-circuiting inspection section for the battery cells according to the disclosure is configured so that the short-circuiting inspection, the activation process, and the charging and discharging process can be sequentially and successively performed for the plurality of battery cells within one pressure activation apparatus, and thus there is no need to separately build short-circuiting inspection equipment, thereby reducing the maintenance, efforts and costs of performing the short-circuiting inspection process, the pressure activation process and the charging and discharging process for the battery cell, and reducing unnecessary waste of space, time, costs, etc. to build the separate equipment.

MODE FOR INVENTION

The short-circuiting inspection performed in the short-circuiting inspection section 130, the preliminary activation process performed in the preliminary activation section 150 and the charging and discharging process performed in the main activation section 170 are performed while the plurality of battery cells are mounted to the jigs which are much the same. Further, the short-circuiting inspection process, the preliminary activation process, and the charging and discharging process for the plurality of battery cells are different in takt time from each other, and thus the number of jigs may be set considering total takt time.

Specifically, as shown in FIG. 1, the short-circuiting inspection section 130 includes one pressurization short-circuiting jig 100 for mounting and pressurizing a plurality of battery cells, and the preliminary activation portion 150 includes a plurality of preliminary jigs 160 for mounting and pressurizing a plurality of battery cells, and the main activation portion 170 includes a plurality of heating jigs 180 for heating and pressurizing the plurality of battery cells, in which the plurality of heating jigs 180 is more than the plurality of preliminary jigs 160.

The short-circuiting inspection section 130 may include only one pressurization short-circuit jig 100. Because the short-circuiting inspection for the plurality of battery cells takes a very short takt time compared to the preliminary activation process and the charging and discharging process, and the efficient spatial arrangement of the entire equipment is taken into account, only one pressurization short-circuit jig 100 may be provided in the short-circuiting inspection section 130.

The one pressurization short-circuit jig 100 has a basic structure in which a plurality of battery cells can be mounted and pressurized, and a schematic configuration thereof will be described below with reference to FIGS. 2 to 5. The plurality of battery cells are simultaneously subjected to the short-circuiting inspection while being mounted to the pressurization short-circuiting jig 100.

Unlike the short-circuiting inspection section 130, the preliminary activation section 150 includes a plurality of preliminary jigs 160 to mount and pressurize the plurality of battery cells. Because the pressure activation process performed in the preliminary activation section 150 takes a relatively long process time compared to the short-circuiting inspection process, not one but a plurality of preliminary jigs 160 may be provided. The preliminary jigs 160 may mount a plurality of battery cells to be preliminarily subjected to the activation process, and may include room temperature jigs to perform the activation process at room temperature or preheating jigs to perform the activation process is performed under pressurized conditions.

The preliminary jigs 160 may be configured to have substantially the same structure as the pressurization short-circuiting jig 100. Therefore, the preliminary jig 160 may have a configuration except a measuring instrument 135 in FIG. 2 to FIG. 5. The preliminary jigs 160 may perform the activation process by simultaneously pressurizing the plurality of battery cells mounted thereto under the control of the controller 190. When the battery cell is pressurized, the pressure causes the battery cell to generate heat, thereby improving the efficiency of the next process, i.e., the charging and discharging process.

Because the plurality of preliminary jigs 160 are provided, the plurality of battery cells that have been subjected to the short-circuiting inspection of the short-circuiting inspection section 130 may be transported to the preliminary jigs that are not performing the pressure activation process. More specifically, when the plurality of battery cells are completely subjected to the pressure activation process and transported to the main activation portion 170, there may be unoccupied preliminary jigs 160 and thus the plurality of battery cells that have been subjected to the short-circuit inspection are transported and mounted to the unoccupied preliminary jigs 160 under the control of the controller 190.

Unlike the short-circuiting inspection section 130, the main activation section 170 includes the plurality of heating jigs 180 to mount and pressurize the plurality of battery cells. Because the charging and discharging process performed in the main activation section 170 takes a relatively long process time compared to the preliminary activation process as well as the short-circuiting inspection process, the plurality of heating jigs 180 may be provided and be more than the preliminary jigs 160.

The heating jigs 180 are configured to have a similar structure to the pressurization short-circuiting jigs 100 or the preliminary jig 160, and further include a heating means for heating the battery cells. Thus, the heating jigs 180 may have the jig configuration as shown in FIGS. 2 to 5, but may have a configuration in which a heating line is formed on a pressurization plate 61 (to be described later). While the heating jigs 180 simultaneously heat and pressurize the plurality of battery cells mounted thereto, the charging and discharging process is performed under the control of the controller 190.

Because the plurality of heating jigs 180 are provided and are more than the preliminary jigs 160, the plurality of battery cells that have been completely subjected to the preliminary activation process in the preliminary activation section 150 may be transported and mounted to the heating jigs that are not performing the charging and discharging process. More specifically, there may be the unoccupied heating jig 180 from which the plurality of battery cells that have been completely subjected to the charging and discharging process are unloaded, and the plurality of battery cells that have undergone the preliminary activation process are transported and mounted to the unoccupied heating jigs 160 under the control of the controller 190.

In this way, only one pressurization short-circuiting jig 100 is provided, the plurality of preliminary jigs 160 are provided, and the plurality of heating jigs 180 are provided and are more than the preliminary jigs 160. Specifically, only one pressurization short-circuiting jig 100 is provided, and the plurality of preliminary jigs 160 and the plurality of heating jigs 180 are provided in consideration of the process time required for the short-circuiting inspection process, the process time required for the preliminary activation process, and the process time required for the charging and discharging process.

Meanwhile, as described above, the short-circuiting inspection section 130 according to the disclosure performs the short-circuiting inspection with respect to all the plurality of battery cells mounted to the pressurization short-circuiting jig 100. To this end, the short-circuiting inspection section 130 may include an instrument 135, and the measuring instrument 135 may be disposed at a lower portion of the pressurization short-circuiting jig 100, as shown in FIGS. 3 and 4.

Specifically, the short-circuiting inspection section 130 includes the measuring instrument 135 that applies a voltage to each of a plurality of battery cells mounted to the one pressurization short-circuiting jig 100 under the control of the controller 190, measures a current, and transmits the current measured for each battery cell to the controller 190.

The instrument 135 applies a voltage to each battery cell through an electrode lead gripper 50, which grips the electrode lead of the battery cell, in the state that the plurality of battery cells mounted to the pressurization short-circuiting jig 100 are pressurized, and measures the current flowing based on the applied voltage. The instrument 135 transmits the current simultaneously measured for each of the battery cells to the controller 190.

The instrument 135 is electrically connected through the electrode lead gripper 50 (see FIGS. 2 to 5), which grips the electrode lead of each battery cell, a cable, etc. in order to apply the voltage and measure the current for each of the battery cells. Further, the instrument 135 is connected to the controller 190 by a wire or wirelessly in order to transmit the current measured corresponding to each of the battery cells to the controller 190.

The controller 190 receives the current measured for each of the battery cells from the instrument 135, and determines whether each of the battery cells is defective or not. For example, a reference current range may be previously set corresponding to a range of a current measured for a normal battery cell, and a battery cell of which the measured current is out of the reference current range may be determined to be defective.

The battery cell determined to be defective may be defective because it is short-circuited, and may also be exploded or dangerous due to a very high current flowing therein when power is applied. Further, to smoothly carryout the overall processes successively and continuously even when the battery cell according to the disclosure is determined to be defective by the controller 190 through the short-circuiting inspection of the short-circuiting inspection section 130, the defective battery cell is transferred together with other normal battery cells to the preliminary activation section 150 and the main activation section 170 without being separately removed or taken out.

For this reason, the battery cell determined to be defective by the controller 190 may be controlled not to undergo the corresponding processes of the preliminary activation section 150 and the main activation section 170. In particular, the main activation section 170 performs the charging and discharging process while the battery cell is heated and pressurized, the battery cell having a short-circuit failure may be too dangerous to be subjected to the same charging and discharging process.

Therefore, the controller 190 may analyze the current measured for each of the battery cells to determine whether each battery cell is defective or not, and perform control so that the battery cells determined to be defective cannot be subjected to the charging and discharging process in the heating jigs 180. Because the controller 190 knows a bar code of a defective battery cell and further knows a channel corresponding to the defective battery cell, it is possible to determine which position or which channel the defective battery cell is mounted to in the heating jigs 180, and consequently control the main activation section 170 so that the charging and discharging process is not performed for the defective battery cell in that channel or position.

Below, the schematic configuration of the pressurization short-circuiting jig 100 included in the short-circuiting inspection section 130 will be described.

FIG. 2 is a schematic plan view of a pressurization short-circuiting jig included in a short-circuiting inspection section of the pressure activation apparatus 200 with the short-circuiting inspection section for a battery cell according to an embodiment of the disclosure. FIG. 3 is a cross-sectional view taken along line A-A' of FIG. 2. and FIG. 4 is a cross-sectional view taken along line B-B' of FIG. 2. FIG. 5 is a perspective view of a pressurization module of a pressurization short-circuiting jig applied to the disclosure.

As shown in FIGS. 2 to 5, the pressurization short-circuiting jig 100 according to an embodiment the disclosure includes a body 70 to which a plurality of battery cells 1 are loaded and mounted, a pressurization module 60 interposed on an interface of each battery cell 1, and a pressurization module actuator 80 for moving the pressurization module 60 to pressurize the battery cell 1, and the electrode lead gripper 50 mounted to at least one of both sides of the pressurization plates 61 making up the pressurization module 60 and elastically gripping the electrode lead 5 of the battery cell 1 through the pressurization process. Here, the battery cell 1 may be a pouch-type battery cell.

The body 70 forms the outer appearance of the pressurization short-circuiting jig 100 according to the disclosure, and has a structure for accommodating the plurality of battery cells 1. Basically, the body 70 may essentially include a lower frame, an upper frame, and a pair of connection frames disposed at opposite sides and connecting the lower and upper frames to form a rigid shape.

The plurality of pressurization modules 60 may be provided in the body 70 so as to be disposed between the plurality of battery cells 1 while facing the front and back sides of the plurality of battery cells 1. Here, the electrode leads 5 of the plurality of battery cells 1 may be disposed along the lateral direction of the plurality of pressure modules 60 perpendicular to the forward and backward directions of the main body 70 (the pressurization direction of a pressurization module 60, i.e., the leftward and rightward directions in FIGS. 2 and 3). In other words, the electrode leads 5 of the plurality of battery cells 1 applied to the disclosure may be disposed to protrude along the lateral direction (i.e., the lateral direction perpendicular to the pressurization direction) between the plurality of pressurization modules 60.

The pressurization module actuator 80 may drive the plurality of pressurization modules 60 to slide along the forward and backward directions (i.e., the pressurization direction) of the main body 70 so that the plurality of pressurization modules 60 can press the front and back sides of the plurality of battery cells 1 in a surface direction.

To this end, the pressurization module actuator 80 may include a driving source 81, a driving plate 83, a driving shaft 85, and a jig guide rail 87. The drive plate 83 may be provided in the main body 70 to face the outermost pressurization module 60 disposed at a first side of the plurality of pressurization modules 60.

The driving shaft 85 is connected to the driving plate 83, and drives the driving plate 83 to slide along the forward and backward directions (i.e., the pressurization direction) of the main body 70 based on the operation of the driving source 81, so that the plurality of pressurization modules 60 can slide along the forward and backward directions (i.e., the pressurization direction) of the main body 70.

The jig guide rail 87 may be fixedly disposed between the pair of connection frames of the main body 70, along the forward and backward directions (i.e., the pressurization direction) of the main body 70. The jig guide rail 87 may be connected penetrating the plurality of pressurization modules 60 and the driving plate 83 to guide the plurality of pressurization modules 60 and the driving plates 83 to slide. As will be described later, the pressurization modules 60 include pressurization guides 63 as shown in FIG. 5 so as to be guided to slide on the jig guide rail 87.

As shown in FIG. 5, the electrode lead gripper 50 is mounted to at least one of the opposite side portions of the pressurization plate 61 of the pressurization module 60, is moved by the pressurization plate 61 as the pressurization module 60 is pressurized, and elastically clamps the electrode lead 5 of the battery cell 1 through this pressurization so that a voltage can be applied from the measuring instrument 135 to the battery cell 1, thereby allowing the measuring instrument 135 to measure the current and the voltage. As described above, the electrode lead gripper 50 is electrically connected to the measuring instrument 135.

As shown in FIG. 5, the pressurization module 60 includes the pressurization plate 61 for pressurizing the battery cell 1, and the electrode lead gripper 50 mounted on the pressurization plate 61 and elastically clamping the electrode lead 5 of the battery cell 1 pressurized by the pressurization plate 61.

The pressurization plate 61 performs an operation of pressurizing the battery cell 1 that is undergoing the short-circuiting inspection process. The pressurization plate 61 of the pressurization short-circuiting jig 100 is similar to the pressurization plate of the heating jig 180 for heating and pressurizing the battery cells which are undergoing the charging and discharging process, and therefore the pressurization plate of the heating jig 180 may be formed by attaching a heating pad to one of both sides of the pressurization plate 61.

Further, the pressurization module 60 according to the disclosure includes the pressurization guide 63 integrally or detachably coupled to the opposite sides of the pressurization plate 61. The pressurization guide 63 is guided by the jig guide rail 87 while the pressurization plate 61 is pressurized and slid as described above, thereby moving stably. The pressurization guide 63 is formed with a pressurization guide hole 64 through which the jig guide rail 87 is disposed.

Although a few embodiments of the disclosure have been described above, it will be apparent for a person having ordinary knowledge in the art that these descriptions are for the illustrative purposes only and various changes can be made without departing from the scope of the disclosure. Accordingly, the genuine technical scope of the disclosure should be defined by the appended claims.

INDUSTRIAL APPLICABILITY

In a pressure activation apparatus with a short-circuiting inspection section for a battery cell according to the disclosure, a short-circuiting inspection, an activation process, and a charging and discharging process are sequentially and successively performed for a plurality of battery cells within a single pressure activation apparatus, and thus there is no need to separately build short-circuiting inspection equipment, thereby having advantages of reducing the maintenance, efforts and costs of performing the short-circuiting inspection process, the pressure activation process and the charging and discharging process for the battery cell, and reducing unnecessary waste of space, time, costs, etc. to build the separate equipment.

The invention claimed is:
1. A pressure activation apparatus with a short-circuiting inspection section for a battery cell, comprising:
- a loading section to load a plurality of battery cells;
- a short-circuiting inspection section to perform a short-circuiting inspection while the plurality of battery cells transported from the loading section are mounted and pressurized;
- a preliminary activation section to perform an activation process while the plurality of battery cells, which have been subjected to the short-circuiting inspection, transported from the short-circuiting inspection section are mounted and pressurized;
- a main activation section to perform a charging and discharging process while the plurality of battery cells, which have been subjected to the activation process, transported from the preliminary activation section are mounted, heated and pressurized; and
- a controller to control the transportation of the plurality of battery cells, the short-circuit inspection, the activation process, and the charging and discharging process,
wherein the short-circuiting inspection section comprises one pressurization short-circuiting jig to mount and pressurize the plurality of battery cells, the preliminary activation section comprises a plurality of preliminary jigs to mount and pressurize the plurality of battery cells, and the main activation section comprises a plurality of heating jigs to heat and pressurize the plurality of battery cells,
wherein the short-circuiting inspection section comprises a measuring instrument to measure a current by applying a voltage to each of the plurality of battery cells mounted to the one pressurization jig under control of the controller, and transmit the current measured for each battery cell to the controller, and
wherein the controller determines whether each battery cell is defective or not by analyzing the current measured for each battery cell, and controls the battery cell determined to be defective not to undergo the charging and discharging process in the heating jigs.

\* \* \* \* \*